United States Patent [19]

Takahashi et al.

[11] Patent Number: 4,864,644
[45] Date of Patent: Sep. 5, 1989

[54] VHF-UHF MIXER HAVING A BALUN

[75] Inventors: Kenichi Takahashi, Kawasaki; Makoto Hasegawa, Tokyo; Mitsuo Makimoto, Yokohama, all of Japan

[73] Assignee: Matsushita Electric Industrial Co., Ltd., Kadoma, Japan

[21] Appl. No.: 109,333

[22] Filed: Oct. 16, 1987

[30] Foreign Application Priority Data

Oct. 17, 1986 [JP] Japan .................. 61-247759
Sep. 4, 1987 [JP] Japan .................. 62-222302

[51] Int. Cl.⁴ ............................................. H04B 1/26
[52] U.S. Cl. .................................. 455/326; 455/330; 455/325
[58] Field of Search ............... 455/325, 327, 330, 320, 455/326, 334

[56] References Cited

U.S. PATENT DOCUMENTS

| | | | |
|---|---|---|---|
| 3,705,366 | 12/1972 | Vergnolle | 455/326 X |
| 4,348,773 | 7/1982 | Caroli | 455/326 |
| 4,492,960 | 1/1985 | Hislop | 455/330 X |
| 4,566,132 | 1/1986 | Meyer et al. | 455/330 X |
| 4,651,344 | 3/1987 | Hasegawa et al. | 455/325 |
| 4,710,974 | 12/1987 | Kupfer | 455/330 X |

FOREIGN PATENT DOCUMENTS

| | | | |
|---|---|---|---|
| 0008005 | 1/1978 | Japan | 455/330 |
| 0134507 | 10/1980 | Japan | 455/326 |
| 0192426 | 9/1985 | Japan | 455/330 |

*Primary Examiner*—Robert L. Griffin
*Assistant Examiner*—Ralph E. Smith
*Attorney, Agent, or Firm*—Cushman, Darby & Cushman

[57] ABSTRACT

A VHF-UHF mixer, which has a balun (14) having a ferrite core (141), a pair of R-C parallel connection circuits (15a) and (15b) connected to output ends of the balun (14), a series connection of two mixing diodes (16a) and (16b) connected across output ends of the R-C parallel connection circuits, and a diplexer (17) consisting of a high pass filter and a low pass filter and connected by its input terminal to center connection point (18) of said series connection of the two mixing diodes, further has a pair of impedance circuits (19a, 19b), each being grounded by one ends thereof, consisting of L-C-L series connection circuit, and connected to either input end or output end of the R-C parallel connection circuit.

10 Claims, 9 Drawing Sheets

VHF-UHF MIXER HAVING A BALUN

FIELD OF THE INVENTION AND RELATED ART STATEMENT

1. Field of the Invention

The present invention relates generally to a mixer circuit for use in microwave circuit in a television set, a CATV system, satellite communication set, or the like, and more particularly to a VHF-UHF mixer having a balun.

2. Description of the Related Art

Recently as technologies of satellite communication or CATV has developed, high performance of microwave circuits becomes a very important matter. Especially, reliability, smallness of size and circuits which have no need of adjustment in mass production line become important items of the microwave circuit. To achieve the above-mentioned items, for instance, a microwave circuit using microstrip lines provided on a dielectric substrate as described in the U.S. Pat. No. 4,651,344 has been utilized. The mixer circuit has a very important role among microwave circuits, and it can be said that the performance of the microwave circuit as a whole is dependent on the performance of the mixer circuit. There are several kinds of mixer circuit such as single-balanced mixer, double-balanced mixer, etc. and furthermore, mixers of respective kinds comprising ferrite core or microstrips in the balun or microstrip circuit comprising diodes or FETs as nonlinear element are generally known.

As a TV broadcasting band, 1 to several GHz band has been utilized, by use of microstrip circuit. When an IF frequency is selected in a low GHz band, use of a ferrite core in the balun becomes effective for decreasing the size of the microwave circuit, which becomes hybrid a configuration having both lumped constant and distributed constant parts. In such microwave circuit, a simple conventional circuit configuration has a problem of undesirable influence by distribution constant. And further, with the simple conventional balun with ferrite core or diode selected only for the purpose of miniaturization, desired characteristic is not necessarily available.

SUMMARY OF THE INVENTION

The present invention aims to improve impedances of necessary various parts, to improve conversion loss and distortion characteristic of a VHF-UHF mixer.

The inventor made many experiments, and found that, by connecting one-end-grounded series connections of lump constant L-C or L-C-L at either ends of parallelconnected C-R circuits, matching, hence return loss, of the VHF-UHF mixer having balun is much improved.

In order to achieve the above-mentioned purpose, the mixer in accordance with the present invention comprises a balun having ferrite core means, for outputting a first and a second signal to its balanced first output terminal and second output terminal at reception of local oscillation signal at its unbalanced input terminal a first R-C parallel connection circuit and a second R-C parallel connection circuit connected by one ends thereof to the first output terminal and the second output terminal, respectively, series connection of a first mixing diode and a second mixing diode, one end of the series connection being connected to the other end of the first R-C parallel circuit, and the other end of the series connection being connected to the other end of the second R-C parallel circuit, a diplexer including filter circuits for extracting signal of desired frequency, connected by its input terminal to center connection point of the series connection of the two mixing diodes, the improvement being to comprise impedance circuits which are grounded by one ends thereof, respectively comprise at least one capacitance element and at least one inductance element, and connected by the other ends thereof to input terminals or output terminals of the first R-C parallel connection circuit and the second R-C parallel connection circuit.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

DESCRIPTION OF THE PREFERRED EMBODIMENT

Preferred embodiments of the present invention are described with the accompanying drawings.

Figure 1:
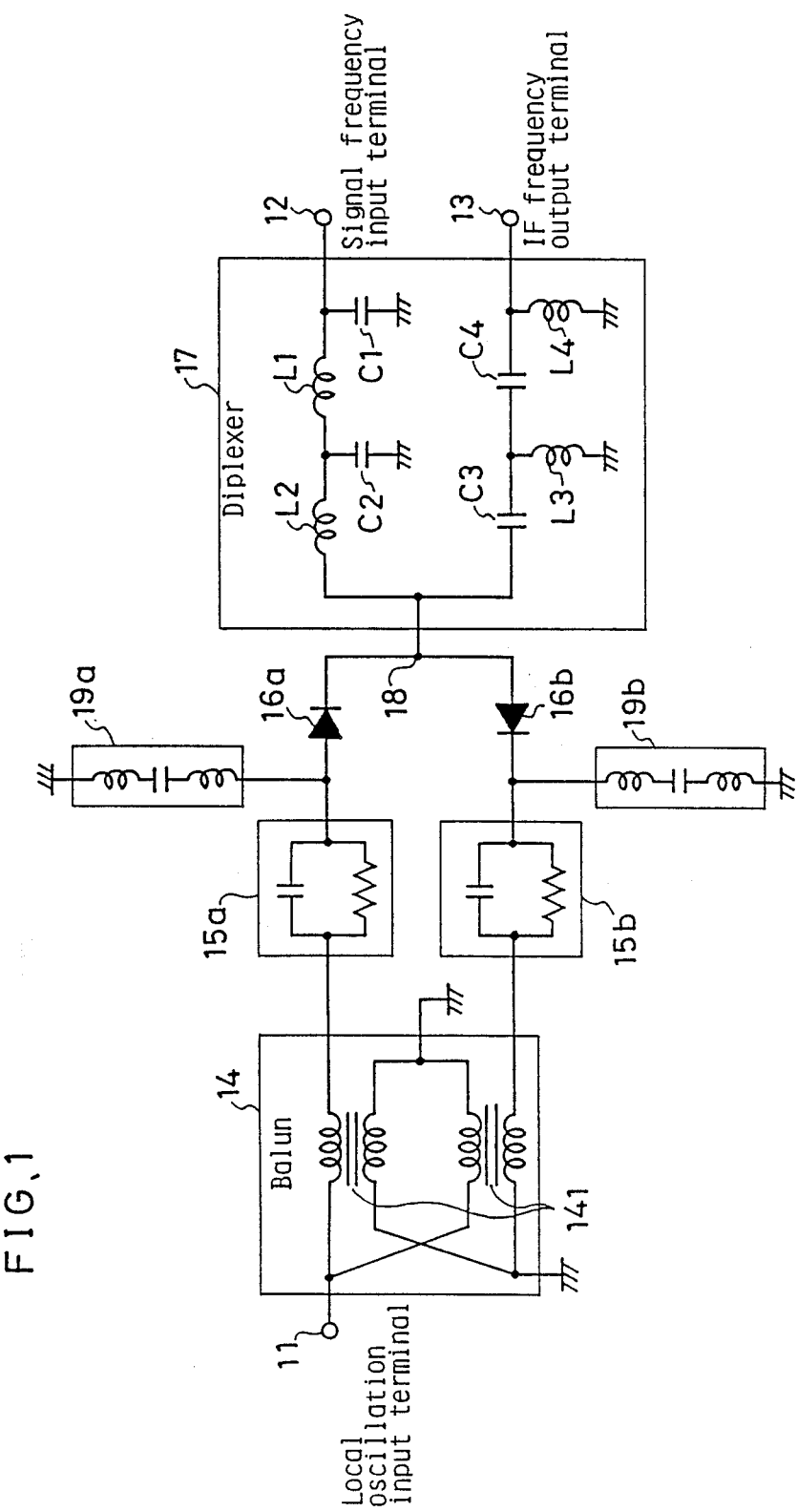
FIG. 1 is a circuit diagram of a mixer circuit of a first embodiment of the present invention.
Figure 2A:
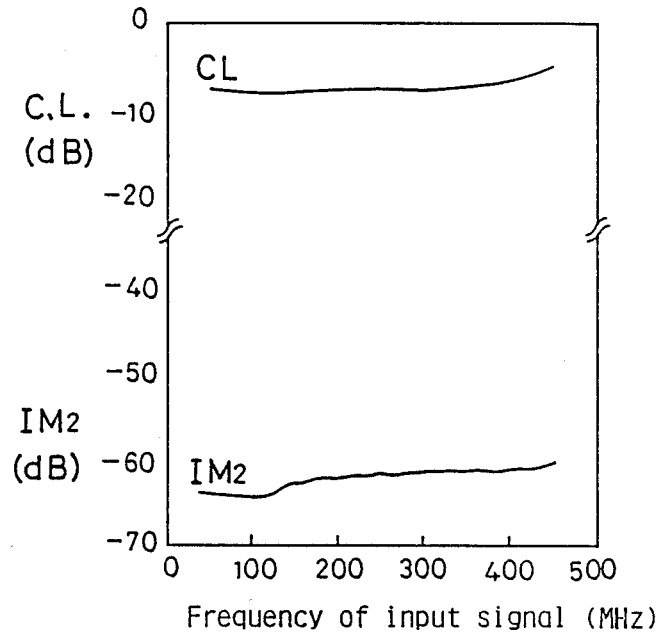
FIG. 2(a) and FIG. 2(b) are characteristic graphs showing conversion losses and second order inter-modulation distortions of the first embodiment and the conventional art, respectively.
Figure 2B:
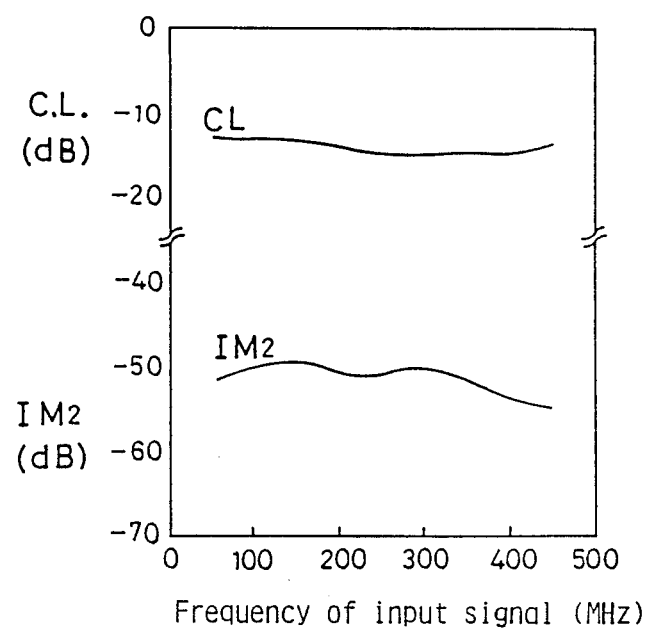
Figure 3:
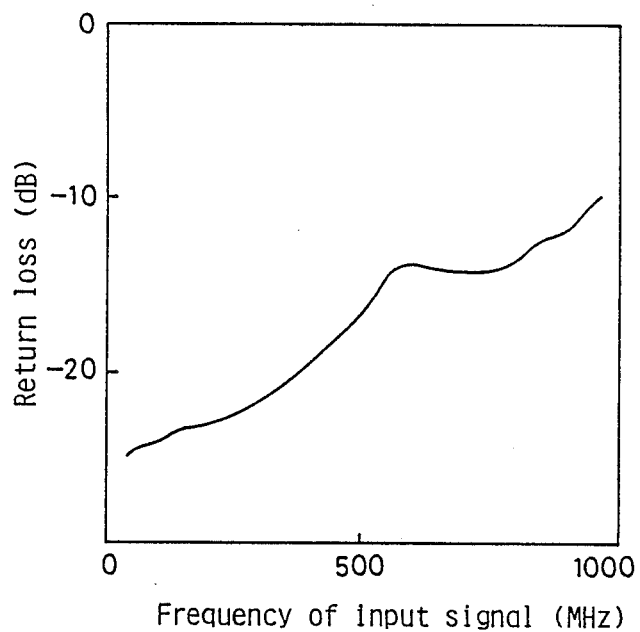
FIG. 3(a) and FIG. 3(b) are characteristic graphs of return-loss seen from center connection point of the series connected mixer diodes to local oscillator of the first embodiment and the conventional art, respectively.
Figure 3:
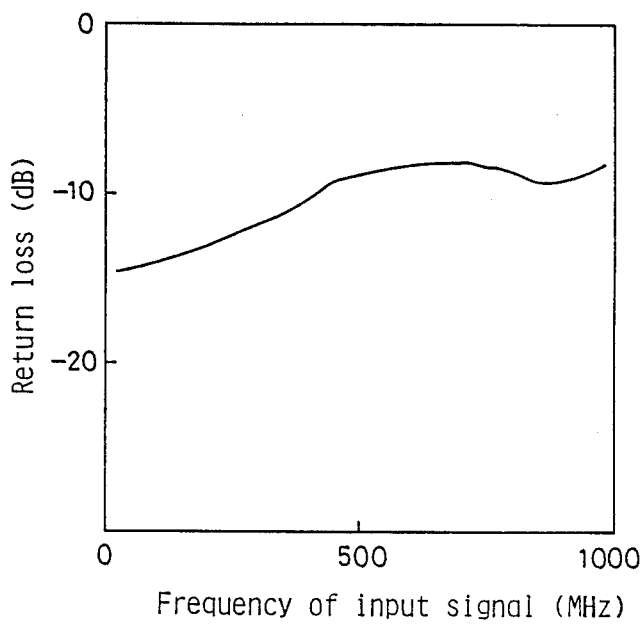

FIG. 1 through FIG. 3 show a first embodiment. The circuit diagram of FIG. 1 show a single balanced mixer using a pair of diodes 16a and 16b. Local oscillation signal is given through a local oscillation input terminal 11 to a known balun having ferrite cores 141, output terminals of which are connected to respective one ends of a series connection of diodes 16a and 16b through respective C-R parallel circuits 15a and 15b. Input signal is given to a signal input frequency terminal 12 of a known diplexer 17. Intermediate frequency signal is issued to an IF frequency output terminal 13 of the diplexer 17. Local oscillation input terminal of the diplexer 17 is connected to the center junction point 18 of the series connected diodes 16a and 16b.

The feature of the first embodiment is that a pair of impedance circuits respectively consisting of L-C-L series connected circuits 19a and 19b, whose respective one ends are grounded, are connected as branches to respective ends of the series connection of the diodes 16a and 16b.

As one example of the above-mentioned embodiment, the balun 14 is made by winding paired wires of 0.22 mm diameter on an Ni-Zn ferrite of 4 mm length×6.5 mm major diameter and 3 mm minor diameter; a pair of Schottky diodes 16a, 16b are used as the series diodes, each of the C-R circuits 15a, 15b are made of capacitors of 10 pF and resistors of 33Ω. Each of L-C-L series connection branches 19a, 19b are made by connecting a 0.5 pF capacitor between a pair of inductors of 5 nH.

The operation of the frequency conversion of input signal to an intermediate frequency, which is of higher frequency than that of the input signal, is elucidated.

The input signal is introduced from the signal frequency input terminal 12 and through a low pass filter constituted by the inductors L1, L2 and capacitors C1 and C2, to the mixer diodes 16a and 16b. The mixer diodes 16a and 16b are driven by the signal of local oscillation frequency which is unbalanced-balanced converted by the balun 14. Then, owing to nonlinearlity of the diodes 16a and 16b, the signal frequency input and local oscillation input, which is introduced through the local oscillation input terminal 11, balun 14 and the C-R parallel circuits 15a and 15b, are mixed thereby subjecting to frequency conversion, and the frequency-converted output is issued to the common connection point 18 of the series connected diodes 16a and 16b. From the signal of the common connection point 18, a signal which is frequency converted to the high frequency is extracted by the diplexer 17 which comprises a high pass filter consisting of two capacitors C3, C4 and two inductors L3, L4, to issue the intermediate frequency output at the IF frequency output terminal 13.

Function of the branch circuits 19a and 19b each consisting of a series connection of an inductance, a capacitance and an inductance was not clearly analyzed, but the following technical advantage was confirmed through experiments. FIG. 2(a) shows second order intermodulation distortion ($IM_2$) when the series circuits 19a and 19b are connected to respective points between the R-C parallel connection circuit 15a and the diode 16a and between the C-R parallel connection circuit 15b and the diode 16b. On the other hand, the second order intermodulation distortion ($IM_2$) when the L-C-L series circuits are not connected is shown in FIG. 2(b). As is clear from FIG. 2(b), when the L-C-L circuits are omitted, the conversion loss (C.L.) of the mixer was about $-13$ dB and the second order intermodulation distortion was lower than $-50$ dB, which characteristics are not satisfactory for mixer circuit. On the other hand, in the embodiment of FIG. 2(a), the conversion loss (C.L.) was improved by about 5 dB and the second order intermodulation distortion was improved by about 10 dB from that of the conventional example of FIG. 2(b).

Furthermore, when the impedance seen from the center connection point 18 between the diodes 16a and 16b to the local oscillation input terminal 11 (namely the return loss) is examined, in case of the conventional case wherein the L-C-L series circuits 19a and 19b are omitted, matching with respect to the input signal frequency at the signal frequency input terminal 12 is not satisfactory as is shown in FIG. 3(b). On the other hand, in case of the present invention having the L-C-L series connection circuit 19a and 19b, the impedance matching was greatly improved (namely return loss was improved) as shown in FIG. 3(a).

As is described with respect to the first embodiment, wherein the VHF-UHF mixer has one or a pair of ferrite cores in the balun 14, by connecting the L-C-L series circuits 19a and 19b, respectively to the connection points between the C-R parallel circuit 15a and the diode 16a and between the C-R parallel circuit 15b and the diode 16b, the conversion loss (C.L.) and the second order intermodulation distortion can be improved.

Figure 4:
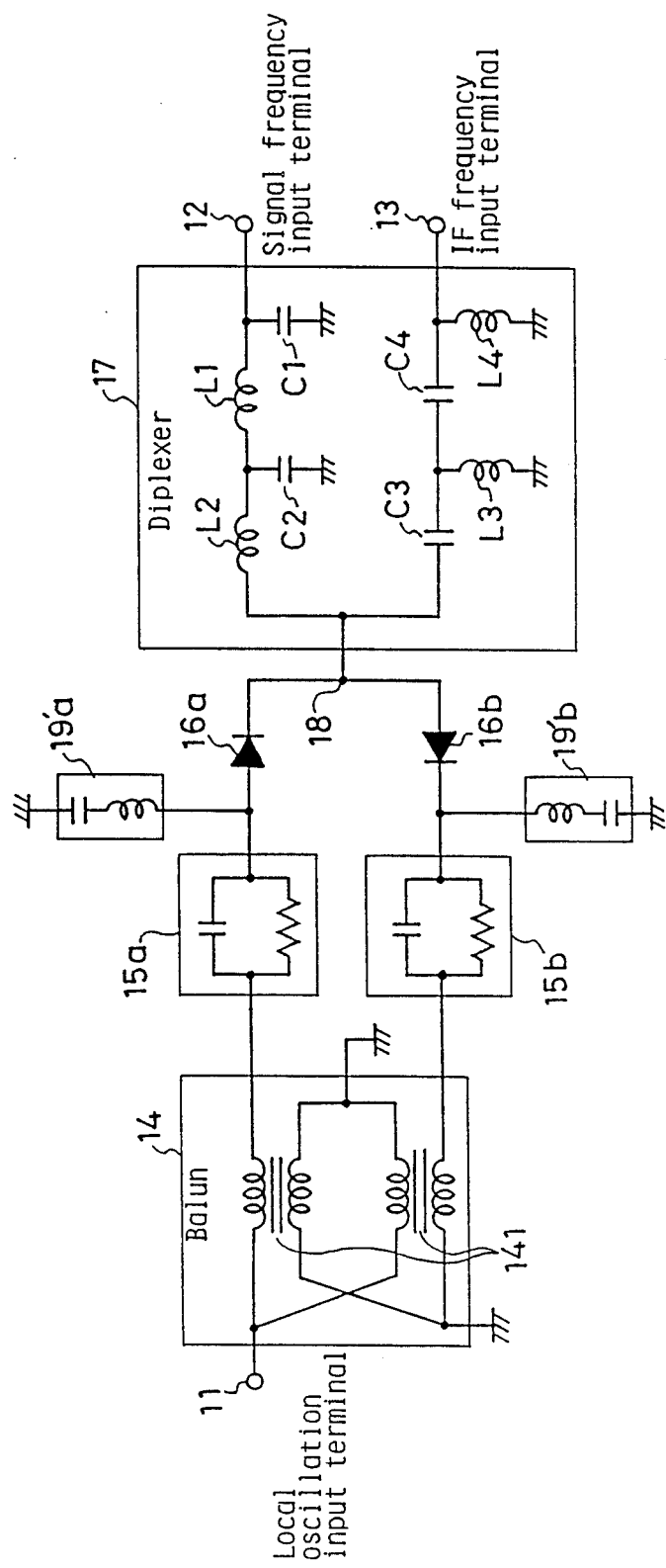
FIG. 4 is a circuit diagram of a mixer circuit of a second embodiment of the present invention.

FIG. 4 shows a second embodiment, wherein in place of the L-C-L series circuits, simpler L-C series circuits are adopted. Other parts of the circuit are configurated in the same way as the circuit of FIG. 1, and the corresponding description apply. The second embodiment of FIG. 4 has similar characteristic improvement to that of the first embodiment.

Figure 5:
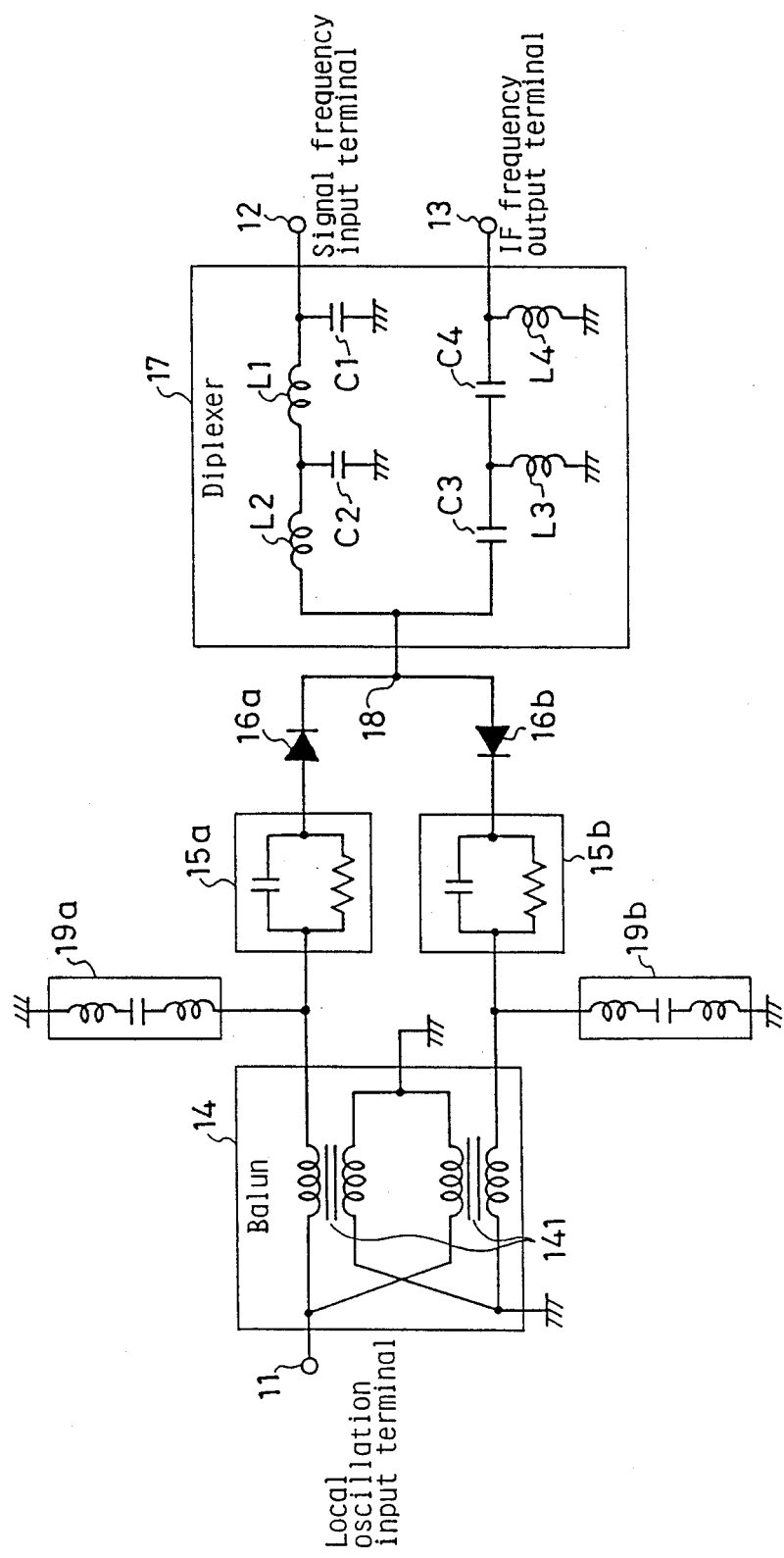
FIG. 5 is a circuit diagram of a mixer circuit of a third embodiment of the present invention.

FIG. 5 shows a third embodiment, wherein the connection of L-C-L series circuits 19a and 19b are made at respective points between the output terminals of the balun 14 and input terminals of the R-C parallel circuit 15a and 15b. Other parts of the circuit are configurated in the same way as the circuit of FIG. 1, and the corresponding description apply. The third embodiment of FIG. 5 has similar characteristic improvement to that of the first embodiment.

Figure 6:
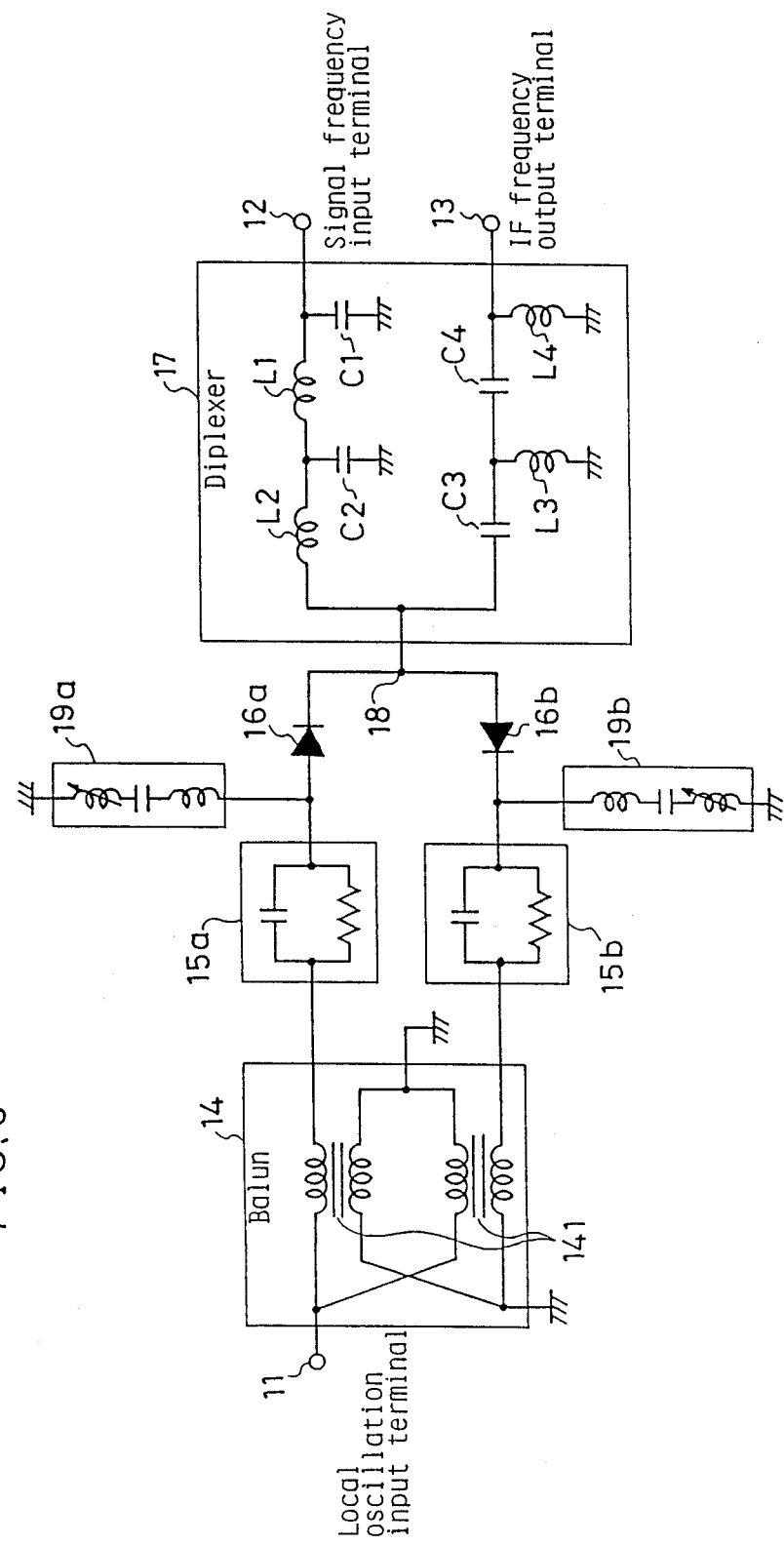
FIG. 6 is a circuit diagram of a mixer circuit of a fourth embodiment of the present invention.
Figure 7:
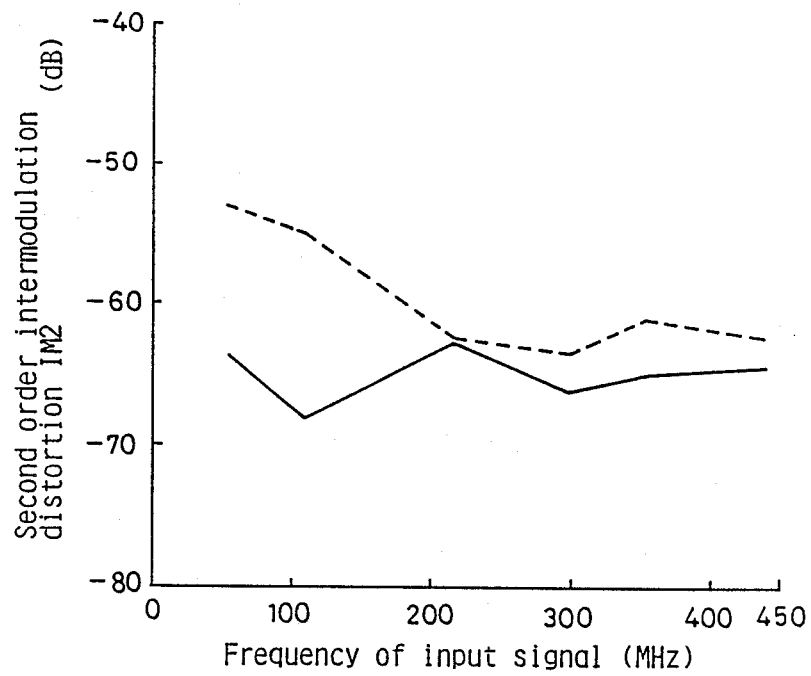
FIG. 7 is a comparison graph showing improvement of the second order inter-modulation distortions of the fourth embodiment.

FIG. 6 shows a fourth embodiment, wherein one of the inductor in each of the series connected L-C-L circuits 19a and 19b are made as variable inductor. Other parts of the circuit are configurated in the same way as the circuit of FIG. 1, and the corresponding description apply. In the above-mentioned configuration, by adjusting either one or both of the variable inductors, the impedances of the mixer can be matched with respect to input signal, local oscillation frequency, and/or intermediate frequency, thereby to achieve decrease of distortion. FIG. 7 shows one example of the characteristic of the circuit of FIG. 6. Though the inductances are constituted by microstrip lines, in this example they are constituted as lumped constant circuit components.

Though FIG. 6 shows that both L-C-L series circuits 19a and 19b has the variable inductors, the variable inductor can be limited only in one of the L-C-L series circuit 19a or 19b.

Figure 8:
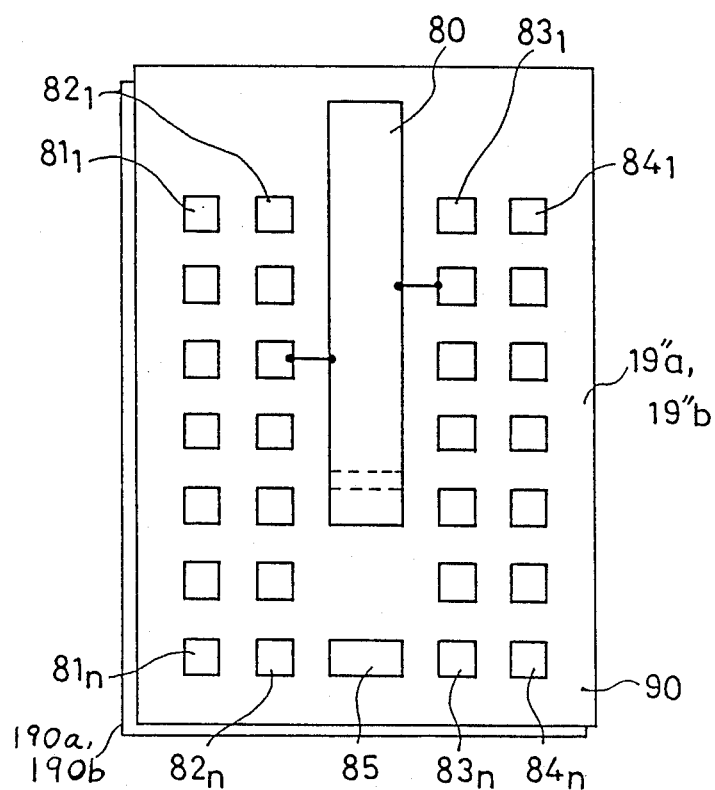
FIG. 8 is a plan view of a circuit board of an LCL series circuit configured by a stub as a component of a fifth embodiment.
Figure 9:
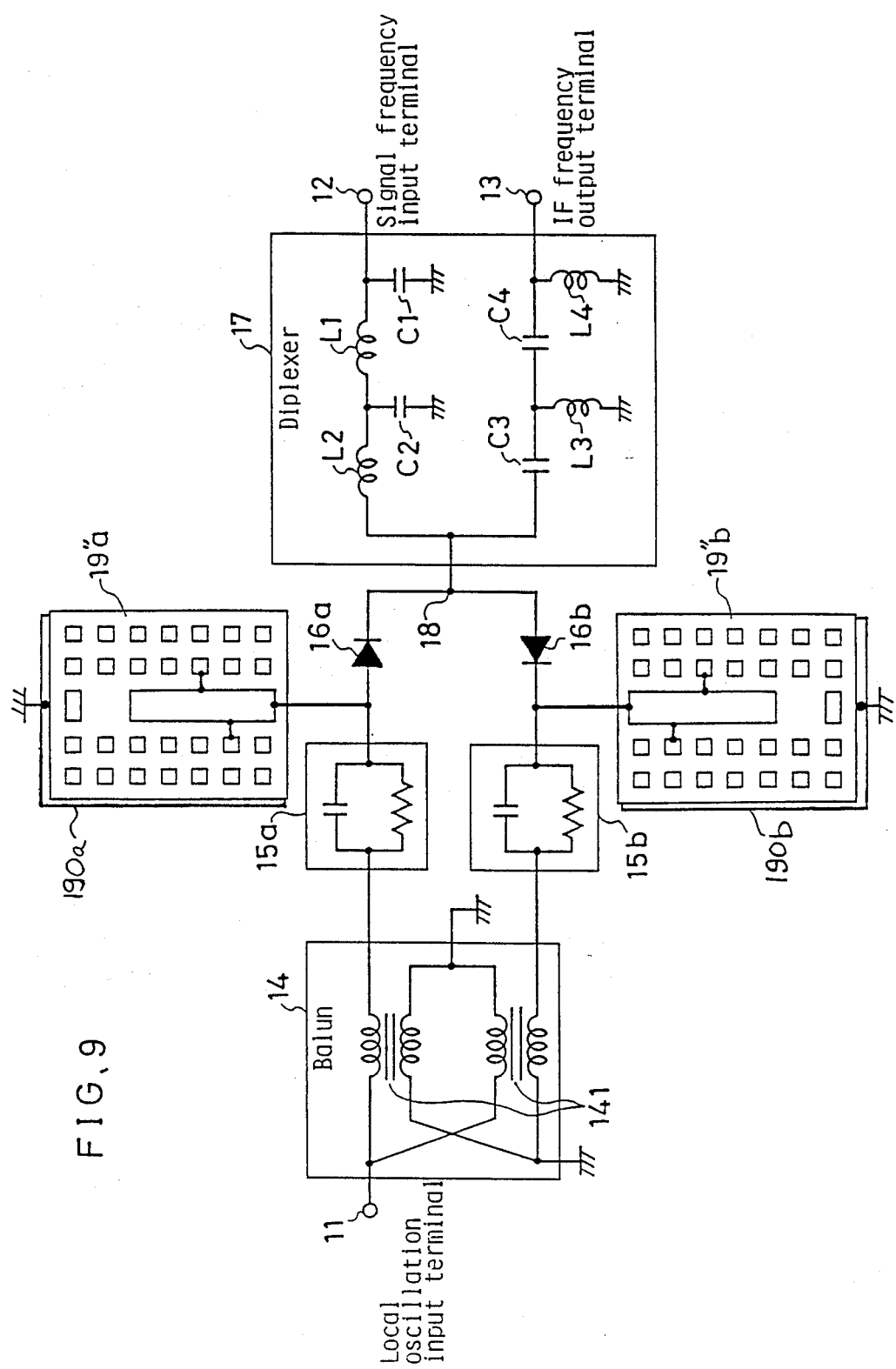
FIG. 9 is a circuit diagram of a mixer circuit of the fifth embodiment.

FIG. 8 and FIG. 9 show a fifth embodiment, wherein in place of the lumped constant L-C-L series circuits, a pair of distributed constant stubs 19″a and 19″b, are adopted. As shown in FIG. 8, the distributed constant stub 19″a or 19″b comprises, on an insulation substrate 90 having grounding electrode 190a or 190b on the whole back face, a microstrip line 80 at center, impedance adjustment lands $81_1, 81_2 \ldots 81_n, 82_1, 82_2 \ldots 82_n, 83_1, 83_2 \ldots 83_n, 84_1, 84_2 \ldots 84_n$. These distributed constant stubs 19″a and 19″b are connected as shown in FIG. 9, to the output ends of the R-C parallel circuits 15a and 15b, respectively, in place of the lumped constant L-C-L circuits 19a and 19b. Other parts of the circuits are configurated in the same way as the circuits of FIG. 1, and the corresponding description apply. For adjustment of the distributed constant stubs 19″a and 19″b for obtaining better matching of the VHF-UHF mixer, the microstrip line 80 is trimmed of its length, or adjustment lands $81_1 \ldots 84_n$ are appropriately connected to suitable points of the microstrip 80, in accordance with known microstrip technology.

As a result of the above-mentioned configuration, desired adjustments for matching of the impedance of the distributed constant stubs are obtainable, thereby the similar operation to those of the foregoing embodiments is obtainable. Other parts of the circuits are configurated in the same way as the circuits of FIG. 1, and the corresponding description apply.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. In a mixer for use in the VHF and UHF range, comprising
    a balun having ferrite core means, for receiving a local oscillation signal at an unbalanced input terminal and transducing said local oscillation signal to output a first signal to a balanced first output terminal and to output a second output signal to a second output terminal,
    a first R-C parallel connection circuit connected by one end to said first output terminal and a second R-C parallel connection circuit connected by one end to said second output terminal,
    a series connection of a first mixing diode and a second mixing diode connected together at a connection node therebetween, one end of the series connection being connected to the other end of said first R-C parallel circuit at a first connection point, and the other end of the series connection being connected to the other end of said second R-C parallel circuit at a second connection point,
    a diplexer including filter circuits for extracting a signal of desired frequency, connected by its input terminal to said connection node of said series connection of the two mixing diodes,
    the improvement comprising:
    first and second impedance circuits, each grounded at one end thereof, each respectively comprising at least one capacitance element and at least one inductance element, and said first impedance circuit connected by the other end thereof to one of an input terminal or an output terminal of said first R-C parallel connection circuit and said second impedance circuit connected by the other end to one of an input terminal or an output terminal of said second R-C parallel connection circuit.

2. In a mixer comprising
    a balun having ferrite core means, for receiving a local oscillation signal at an unbalanced input terminal and transducing said local oscillation signal to output a first signal to a balanced first output terminal and to output a second output signal to a second output terminal,
    a first R-C parallel connection circuit connected by one end thereof to said first output terminal and a second R-C parallel connection circuit connected by one end to said second output terminal,
    a series connection of a first mixing diode and a second mixing diode connected together at a connection node therebetween, one end of the series connection having said first mixing diode being connected to the other end of said first R-C parallel circuit at a first connection point, and the other end of the series connection having said second mixing diode being connected to the other end of said second R-C parallel circuit at a second connection point,
    a diplexer including filter circuits for extracting a signal of desired frequency, connected by its input terminal to said connection node of said series connection of the two mixing diodes,
    the improvement comprising first and second impedance circuits each are grounded at one end thereof, each respectively comprising at least one capacitance element and at least one inductance element, said first impedance circuit connected by the other end thereof to said first connection point between said first R-C parallel connection circuit and said first mixing diode, and said second impedance circuit connected by the other end thereof to said second connection point between said second R-C parallel connection circuit and said second mixing diode.

3. A mixer in accordance with claim 2 wherein each said impedance circuit comprises lumped constant capacitors and lumped constant inductors.

4. A mixer in accordance with claim 2 wherein each said impedance circuit comprises microstrip line and stubs.

5. In a mixer comprising:
    a balun having ferrite core means, for receiving a local oscillation signal at an unbalanced input terminal and transducing said local oscillation signal to output a first signal to a balanced first output terminal and to output a second output signal to a second output terminal;
    a first R-C parallel connection circuit connected by one end to said first output terminal and a second R-C parallel connection circuit connected by one end to said second output terminal,
    a series connection of a first mixing diode and a second mixing diode connected together at a connection node therebetween, one end of the series connection being connected to the other end of said first R-C parallel circuit, and the other end of the series connection being connected to the other end of said second R-C parallel circuit,
    a diplexer including filter circuits for extracting a signal of desired frequency, connected by its input terminal to said connection node of said series connection of the two mixing diodes,
    the improvement comprising first and second impedance circuits each grounded by one end thereof, and each comprising at least one capacitance element and at least one inductance element, and said first impedance circuit connected by the other end thereof to said first connection point between said first R-C parallel connection circuit and said first output terminal of said balun and said second impedance circuit connected by the other end thereof to said second connection point between said second R-C parallel connection circuit and said second output terminal of said balun.

6. A mixer in accordance with claim 5 wherein each said impedance circuit comprises lumped constant capacitors and lumped constant inductors.

7. A mixer in accordance with claim 5 wherein each said impedance circuit comprises microstrip line and stubs.

8. A mixer in accordance with claim 3, 4, 6 or 7, wherein at least one of said lumped constant inductors is a variable inductor.

9. A mixer in accordance with claim 3 or 6, said impedance circuit is an L-C-L series connection circuit.

10. A mixer in accordance with claim 3 or 6, said impedance circuit is an L-C-variable L series connection circuit.

* * * * *